(12) United States Patent
Bhamidipati et al.

(10) Patent No.: US 9,496,926 B2
(45) Date of Patent: Nov. 15, 2016

(54) GALVANIC ISOLATOR

(71) Applicant: TEXAS INSTRUMENTS INCORPORATED, Dallas, TX (US)

(72) Inventors: Bharadvaj Bhamidipati, Richardson, TX (US); Swaminathan Sankaran, Allen, TX (US); Mark W. Morgan, Allen, TX (US); Gregory E. Howard, Plano, TX (US); Bradley A. Kramer, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 520 days.

(21) Appl. No.: 14/050,984

(22) Filed: Oct. 10, 2013

(65) Prior Publication Data
US 2014/0346887 A1 Nov. 27, 2014

Related U.S. Application Data

(60) Provisional application No. 61/827,478, filed on May 24, 2013.

(51) Int. Cl.
*H01F 27/42* (2006.01)
*H04B 5/00* (2006.01)
(52) U.S. Cl.
CPC .......... *H04B 5/0087* (2013.01); *H04B 5/005* (2013.01)
(58) Field of Classification Search
CPC ............... H04B 5/0087; H04B 5/005

USPC ......................................... 307/104
See application file for complete search history.

(56) References Cited

U.S. PATENT DOCUMENTS

| | | | |
|---|---|---|---|
| 5,945,728 A | 8/1999 | Dobkin et al. | |
| 7,421,028 B2* | 9/2008 | Dupuis | H01L 23/66 375/258 |
| 7,468,547 B2 | 12/2008 | Harvey | |
| 2014/0224998 A1* | 8/2014 | Kholomeev | H01F 19/04 250/396 R |
| 2014/0290930 A1* | 10/2014 | Peters | E21B 17/028 166/65.1 |

FOREIGN PATENT DOCUMENTS

WO WO 2004/100222 A2 11/2004

\* cited by examiner

*Primary Examiner* — Jared Fureman
*Assistant Examiner* — Duc M Pham
(74) *Attorney, Agent, or Firm* — John R. Pessetto; Charles A. Brill; Frank D. Cimino

(57) ABSTRACT

A system on a package (SOP) can include a galvanic isolator. The galvanic isolator can include an input stage configured to transmit an input RF signal in response to receiving an input modulated signal. The galvanic isolator can also include a resonant coupler electrically isolated from the input stage by a dielectric. The resonant coupler can be configured to filter the input RF signal and transmit an output RF signal in response to the input RF signal. The galvanic isolator can further include an output stage electrically isolated from the resonant coupler by the dielectric. The output stage can be configured to provide an output modulated signal in response to receiving the output RF signal.

6 Claims, 10 Drawing Sheets

GALVANIC ISOLATOR

RELATED APPLICATION

This application claims the benefit of U.S. Provisional Application No. 61/827,478, filed May 24, 2013 and entitled HIGH-SPEED/HIGH VOLTAGE DIGITAL ISOLATORS USING TUNED FILTER STRUCTURES TO PROVIDE GALVANIC ISOLATION BETWEEN THE TWO SIDES OF A CHIP (PACKAGE), which is incorporated herein by reference in its entirety.

TECHNICAL FIELD

This disclosure relates to a galvanic isolator, and more particularly, to a system on a package (SOP) that includes a galvanic isolator.

BACKGROUND

Galvanic isolation is a principle of isolating functional sections of electrical systems to prevent current flow such that no (metallic) conduction path is permitted. Energy and/or information can still be exchanged between the sections by other techniques, such as capacitance, induction or electromagnetic waves, or by optical, acoustic or mechanical techniques.

Galvanic isolation can be employed where two or more electric circuits need to communicate, but the two or more circuit have grounds that may be at different potentials. Galvanic isolation can be an effective method of breaking ground loops by preventing unwanted current from flowing between two units sharing a ground conductor. Galvanic isolation can also be employed for safety, such as preventing accidental current from reaching ground through a person's body.

SUMMARY

One example relates to a system on package (SOP) that can include a galvanic isolator. The galvanic isolator can include an input stage configured to transmit an input RF signal in response to receiving an input modulated signal. The galvanic isolator can also include a resonant coupler electrically isolated from the input stage by a dielectric. The resonant coupler can be configured to filter the input RF signal and transmit an output RF signal in response to the input RF signal. The galvanic isolator can further include an output stage electrically isolated from the resonant coupler by the dielectric. The output stage can be configured to provide an output modulated signal in response to receiving the output RF signal.

Another example relates to a system that includes a given circuit configured to provide an input signal. The system can also include an SOP that includes a galvanic isolator. The galvanic isolator can include an input stage configured to transmit an input RF signal in response to receiving an input modulated signal corresponding to the input signal. The galvanic isolator can also include a resonant coupler electrically isolated from the input stage by a dielectric. The resonant coupler can be configured to filter the input RF signal provide an output RF signal in response to the input RF signal. The galvanic isolator can further include an output stage electrically isolated from the resonant coupler by the dielectric. The output stage can be configured to provide an output modulated signal in response to receiving the output RF signal. The system can further include another circuit connected to the output stage. The other circuit can be configured to receive an output signal corresponding to the output modulated signal. The given circuit and the other circuit can be configured to operate based on different voltage levels.

Yet another example relates to an SOP including an input circuit formed on a first die of the SOP. The input circuit can be configured to modulate an input signal onto a predefined carrier frequency to provide an input modulated signal. The SOP can also include an output circuit formed on a second die of the SOP. The output circuit can be configured to demodulate an output modulated signal. The SOP can include a galvanic isolator formed on a third die of the SOP. The galvanic isolator can be configured to transmit an input RF signal based on the input modulated signal. The galvanic isolator can also be configured to transmit an output RF signal in response to wirelessly receiving the input RF signal. The galvanic isolator can further be configured to provide the output modulated signal in response to wirelessly receiving the output RF signal.

Still another example relates to an SOP that includes a galvanic isolator configured to filter an input modulated signal. The galvanic isolator can include an input stage configured to transmit a signal corresponding to an output RF signal in response to receiving the input modulated signal. The galvanic isolator can also include an output stage electrically isolated from the input stage by a dielectric. The output stage can be configured to provide an output modulated signal in response to receiving the output RF signal.

DETAILED DESCRIPTION

A galvanic isolator can be implemented on a system on a package (SOP). The galvanic isolator can include an input stage that can be configured as a radio frequency (RF) transmitter that can transmit an input RF data signal based on a modulated data signal. The galvanic isolator can filter the input RF data signal. The input RF data signal can be received by a resonant coupler that can be conductively isolated from the input stage by a predefined distance. The resonant coupler can wirelessly provide an output RF data signal to an output stage of the galvanic isolator. The output stage of the galvanic isolator can be configured to provide a modulated output data signal in response to the output RF data signal. The galvanic isolator can achieve a percentage bandwidth of about 5% to about 100% by using the resonant coupler for isolated data transmission. The approach also can be implemented with low power consumption due to efficient modulation and demodulation and can support burst mode operation as well as asynchronous data transmission.

Figure 1:
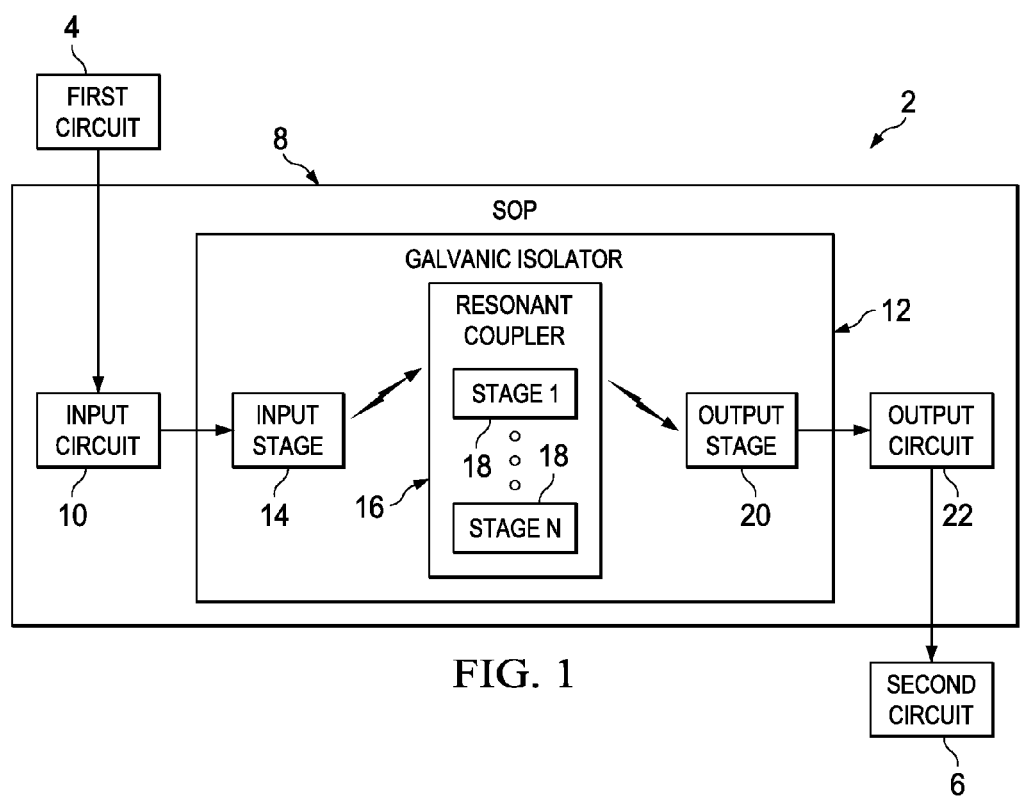
FIG. 1 illustrates an example of a system that includes a first circuit and a second that can communicate via system on a package (SOP) that includes a galvanic isolator.

FIG. 1 illustrates an example of a system 2 that includes a first circuit 4 and a second circuit 6 that can communicate via an SOP 8. As used herein, the term "SOP" can include multiple integrated circuit (IC) chips with a laminate filter that can be housed together. Thus, the SOP can include a case (e.g., a substrate) with electrical contacts to connect the SOP a printed circuit board (PCB). The first circuit 4 can have a first voltage level and the second circuit 6 can have a second voltage level that can be different than the first voltage level. In a first example, the first voltage level can be a relatively low voltage level (e.g., about 0-100 volts (V)) and the second voltage level can be a relatively higher voltage level (e.g., 1 kV-15 kV). For instance, in the first example, the first circuit 4 could be implemented as low power IC chips (e.g., a computer, a controller or the like) and the second circuit 6 could be implemented as high power circuit components (e.g., an industrial transformer, a high power transmitter or the like). In this example, the first circuit 4 and the second circuit 6 can have isolated ground voltages, such that there is no common ground between the first circuit 4 and the second circuit 6. That is, the first circuit 4 and the second circuit 6 can have different ground potentials. Accordingly, in the first example, conductive electrical communication (e.g., a conducting wire) between the first circuit 4 and the second circuit 6 could cause damage to components at the first circuit 4 and/or the second circuit 6.

To avoid such damage, the SOP 8 can enable communications between the first circuit 4 and the second circuit 6. The SOP 8 can include an input circuit 10 that can receive data from the first circuit 4. The data could be, for example, a digital signal, such as a binary data signal, which signal can be referred to as a data signal. The data signal could be, for example, a series of pulses. The input circuit 10 can be configured to modulate the data signal onto a carrier signal, which signal can be referred to as an input modulated data signal. In some examples, the carrier signal could be a signal with a frequency of about 16 gigahertz (GHz) to about 24 GHz. Other frequencies could be used for the carrier signal. In some examples, the input modulated data signal can be a pulse-width modulated (PWM) signal, a pulse code modulated (PCM) signal or the like. In some examples, the input modulated data signal could be provided in burst mode and/or asynchronously. The input modulated data signal can be provided to a galvanic isolator 12. The input circuit 10 and the galvanic isolator 12 can be implemented on different dies of the SOP 8. The input circuit 10 can be implemented, for example as a transmitter.

The galvanic isolator 12 can include an input stage 14 that can receive the input modulated data signal. In some examples, the input stage 14 can be configured as an RF transmitter that can transmit an input RF data signal based on the input modulated data signal from the input circuit 10. The input RF data signal can the input modulated data signal can be substantially the same signal, such that the input stage 14. The input RF data signal can be received wirelessly by a resonant coupler 16. The resonant coupler can be electrically isolated from the input stage 14 by dielectric material. The dielectric material can extend a selectable distance. In some examples, the selectable distance can be about 0.5 millimeters (mm) or more. In some examples, the input stage 14 can be on a first level of the SOP 8 and the resonant coupler 16 can be on a second, different level that is spaced apart from the first level, such that the input stage 14 (or some portion thereof) can overlay the resonant coupler 16 or vice versa. The dielectric thus can provide an isolation barrier with a relatively high coupling coefficient. The dielectric could be implemented, for example, as laminate, flex or crystalline material, such as silicon, glass or another highly resistive material with adequate breakdown characteristics.

The resonant coupler 16 can include N number of stages 18, where N is an integer greater than or equal to one. Each of the N number of stages 18 can be configured as a bandpass filter that can remove spurious noise through filtering, such as low frequency noise. In some examples, one or more of the N number of stages 18, as well as input and output stages 14, 20 can be configured (e.g., as a high pass filter) to improve common mode transient immunity (CMTI). Each of the N number of stages 18 of the resonant coupler 16 can be implemented as an individual resonator or as a circuit that operates in a manner similar to a resonator. For example, each of the N number of stages 18 can be electrically isolated from the other stage(s) by a dielectric that can provide an isolation barrier. Additionally, each of the N number of stages 18 can be spatially arranged in series. In some examples, by employing more than one stage 18, the percentage bandwidth of the resonant coupler 16 can be increased at higher frequencies and add galvanic isolation at lower frequencies. The final (Nth) stage of the resonant coupler 16 can provide an output RF data signal to an output stage 20 of the galvanic isolator 12.

The output stage 20 can be configured to operate in an inverse manner with respect to the input stage 14 of the galvanic isolator 12 (e.g., as a receiver). The output stage 20 can also be implemented on the first layer of the SOP 8 and can be electrically isolated from the resonant coupler 16 by a dielectric material extending the selectable distance (e.g., about 0.5 mm or more). In some examples, the output stage 20 (or some portion thereof) can overlay the resonant coupler 16 or vice versa. The output stage 20 of the galvanic isolator 12 can be configured to provide an output modulated data signal to an output circuit 22 in response to the output RF data signal from the resonant coupler 18. The output modulated data signal and the output RF data signal can be substantially the same signal. The galvanic isolator 12 and the output circuit 22 can be implemented on different dies of the SOP 8. Moreover, the output circuit 22 and the input circuit 10 can also be implemented on separate dies of the SOP 8. The output circuit 22 can be implemented, for example, as a receiver.

In some examples, the resonant coupler 18 can omitted. In such a situation, the input stage 14 can overly the output stage (or some portion thereof) or vice versa. Additionally, in this example, the input stage 14 can wirelessly transmit the output RF data signal to the output stage 20 of the galvanic isolator 12.

By implementing the galvanic isolator 12 in this manner, the galvanic isolator can be implemented as a tuned filter, and the galvanic isolator 12 can be a passive circuit component that requires no external power to operate. The galvanic isolator 12 can achieve percentage bandwidths between about 5% to about 100%, with high efficiency coupling (e.g., low power loss) can be achieved thereby providing a low power per bit transfer cost. In some examples, the galvanic isolator 12 can achieve an isolation of up to about 2-20 kV. Additionally, by selecting particular materials, such as the aforementioned laminate, flex or crystalline materials, a relatively high breakdown voltage can inherently be achieved. In some examples, the galvanic isolator 12 can support a data throughput of up to about 500 megabits per second (Mbps) or even greater. In this manner, the galvanic isolator 12 can support a larger data throughput than conventional coupling technologies such as a passive transformer, a coupling capacitor, infrared or the like.

Further, by altering the size(s) of the input stage 14, the output stage 20 and/or the resonant coupler 16, a specific frequency response can be achieved. For example, by increasing or decreasing the spacing between the resonant coupler 16 and the input stage 14 and the output stage 20, a desired galvanic isolation, percentage bandwidth and/or coupling coefficient can be achieved.

The output circuit 22 can be configured to demodulate the output modulated data signal and condition the modulated data output signal to generate an output data signal. The output data signal can be at a voltage level corresponding to the voltage level of the second circuit 6 (the second voltage level). Accordingly, the first circuit 4 can provide data to the second circuit 6 at a relatively high data rate (e.g., up to or greater than about 500 Mbps) while still maintaining galvanic isolation, thereby reducing and/or eliminating the chances of the second circuit 6 causing damage to the first circuit 4, or vice versa.

Figure 2:
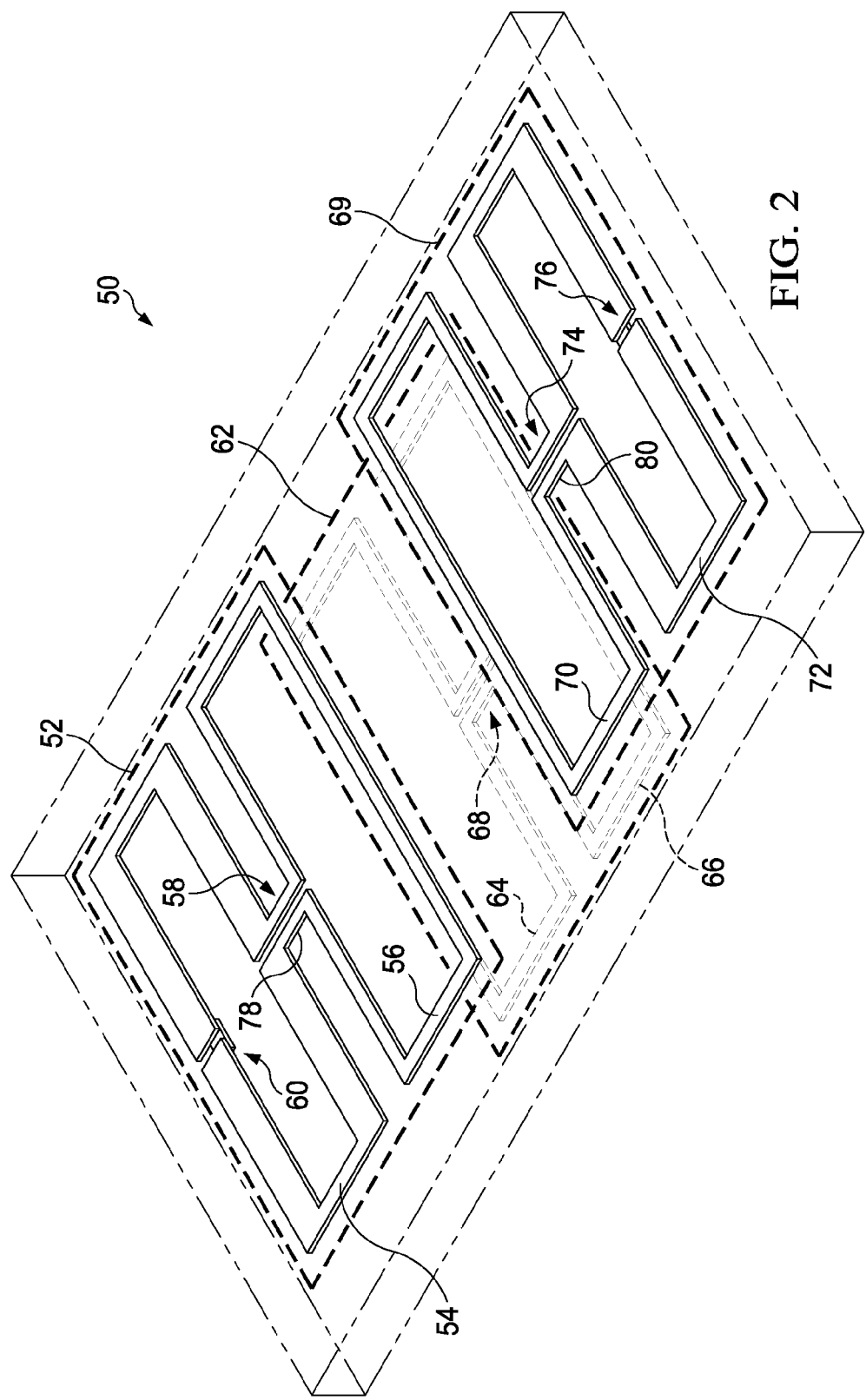
FIG. 2 illustrates an example of a galvanic isolator.

FIG. 2 illustrates an example of a galvanic isolator 50 that could be employed, for example, to implement the galvanic isolator 12 illustrated in FIG. 1. The galvanic isolator 50 can be implemented, for example, as a self-resonant microwave filter that can be implemented on a substrate that includes polyimide dielectric material to provide a desired isolation and coupling coefficient. The galvanic isolator 50 can include, for example, an input stage 52. The input stage 52 could be implemented, for example, as a resonant element formed of a conductive trace on a layer of an SOP. The input stage 52 can be configured as a pair of conductive loops, namely, a first loop 54 and a second loop 56. The first loop 54 and the second loop 56 of the input stage 52 can be electrically connected by a transmission line 58, which can be implemented as a portion of the conductive trace that runs parallel to another portion. In some examples, the width of the trace at the first loop 54 can be greater than the width of the trace at the second loop 56, such as about twice as wide. The input stage 52 can receive an input modulated data signal at an input port 60.

The input port 60 can be formed of two ends of the conductive trace that are separated by a dielectric material. The modulated data signal can be tuned to a resonant frequency of the input stage 52. Thus, upon receiving the input modulated data signal, the input stage 52 can transmit an input RF data signal that can be transmitted wirelessly to a resonant coupler 62. The resonant coupler 62 could be implemented, for example, as a resonant element that is formed from a trace on the SOP. In some examples, the resonant coupler 62 can be a microwave filter. The resonant element of the resonant coupler 62 can be formed as a pair of loops, namely a first loop 64 and a second loop 66 that are conductively coupled by a transmission line 68. The resonant coupler 62 can be implemented on a layer of the SOP that is different from the input stage 52. For instance, as illustrated in FIG. 2, the second loop 56 of the input stage 52 can overlay the first loop 64 of the resonant coupler 62. The input stage 52 and the resonant coupler 62 can be separated, for example, by a dielectric. The input stage 52 and the resonant coupler 62 can be separated by selectable distance (e.g., about 0.5 mm or more). Such spacing can provide a desired amount of galvanic isolation but be sufficiently close to receive the wireless signal from the input stage 52. In FIG. 2, only one stage of the resonant coupler 62 is illustrated. However, in other examples, multiple instances of the resonator can be wirelessly coupled in series to form a plurality of stages (e.g., the N number of stages 18 illustrated in FIG. 1) to provide desired spectral characteristics. Such desired spectral characteristics can include, for example, a specific percentage bandwidth and/or a specific level of galvanic isolation.

The resonant coupler 62 can receive the input RF data signal by a wireless transmission at the first loop 64 of the resonant coupler 62. Upon receiving the input RF data signal, the first loop 64 of the resonant coupler 62 can induce (e.g., transmit) an output RF data signal at the second loop 66 of the resonant coupler 62. The output RF data signal can be wirelessly transmitted to an output stage 69.

The output stage 69 can also be implemented as another resonant element. The output stage 69 can also be formed of a conductive trace. In some examples, the output stage 69 can be formed in the same layer as the input stage 52. In other examples, the output stage 69 and the input stage 52 can be formed in different layers. The output stage 69 can be formed of a pair of conductive loops, namely a first loop 70 and a second loop 72. In some examples, a width of the trace can be greater at the second loop 72 than the first loop 70, such as about twice as wide. The first loop 70 and the second loop 72 can be coupled by a transmission line 74. The first loop 70 of the output stage 69 can overlay the second loop 66 of the resonant coupler 62. Moreover, the output RF data signal can be received at the first loop 70 of the output stage 69. Receiving the output RF data signal can induce (e.g., transmit) an output modulated data signal at an output port 76 of the output stage 69. The output port 76 of the output stage 69 can be formed in a manner similar to the input port 60 of the input stage 52. In this manner the input stage 52 can be coupled (wirelessly) to the output stage 69 of the galvanic isolator 50 to allow data to be transferred between the input stage 52 and the output stage 69 while still maintaining a desired galvanic isolation, percentage bandwidth (e.g., pass band) and/or coupling coefficient.

In some examples, the input stage 52 and the output stage 69 can be center tapped, wherein one line of the transmission line 58, such as line 78, and one line of the transmission line 74, such as line 80 are coupled to an electrically neutral node (e.g., AC ground). Such a configuration can allow the galvanic isolator 50 to filter common mode signals (e.g., increase CMTI) and/or filter low frequency differential signals.

As an example, the galvanic isolator 50 can be sized about 3 mm by about 3 mm. Moreover, the galvanic isolator 50 can achieve percentage bandwidths between 5-100%, with high efficiency coupling (e.g., low power loss) thereby providing a low power per bit transfer cost. In some examples, the galvanic isolator 50 can achieve an isolation of up to about 2-20 kV. As explained with respect to FIG. 1, features, such as the sizing and spacing of the components of the galvanic isolator 50 can be adjusted to achieve particular characteristics. For example, by adjusting the size of the loops of the input stage 52, the output stage 69 and the resonant coupler 62, the resonance of each respective component can be set, such that a desired galvanic isolation, percentage bandwidth and/or coupling coefficient can be achieved.

Figure 3:
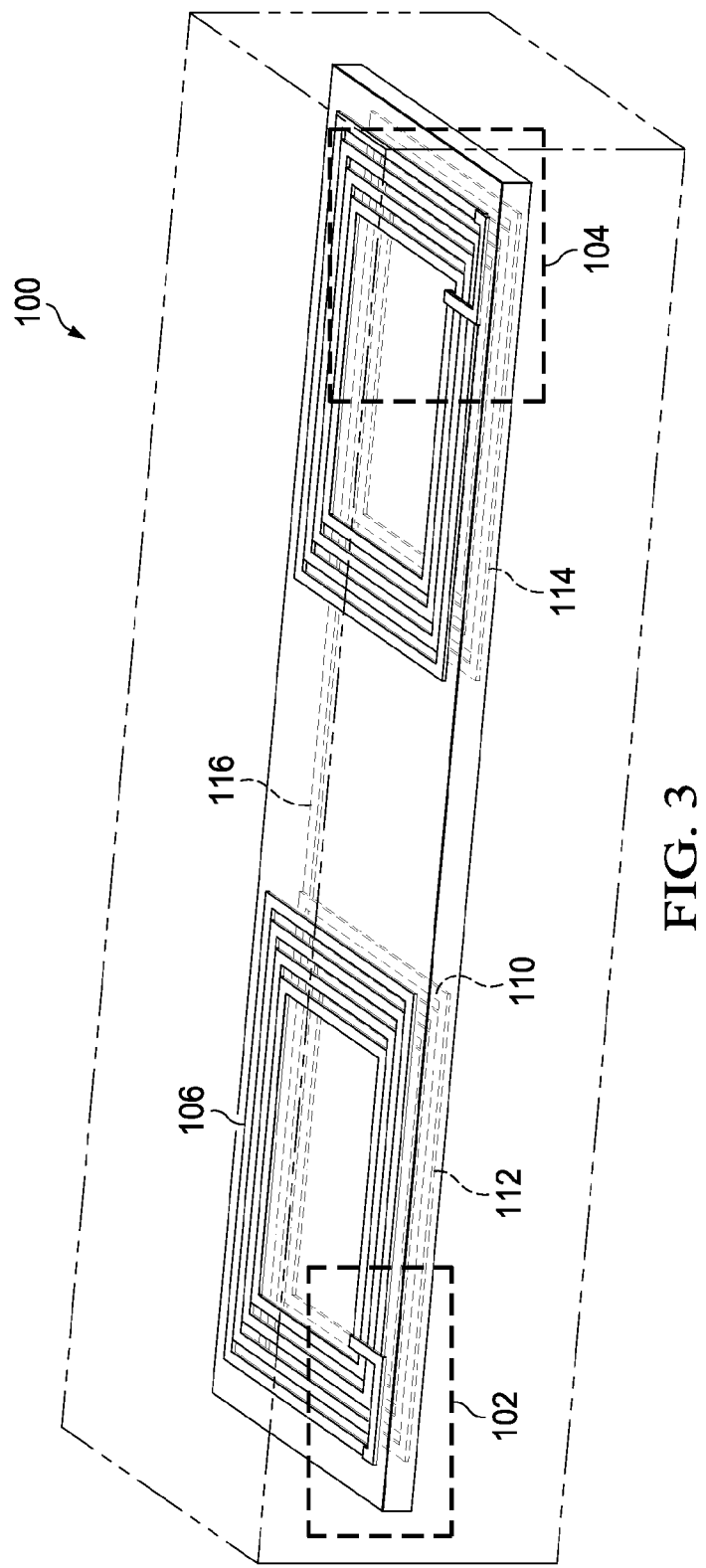
FIG. 3 illustrates another example of a galvanic isolator.
Figure 4:
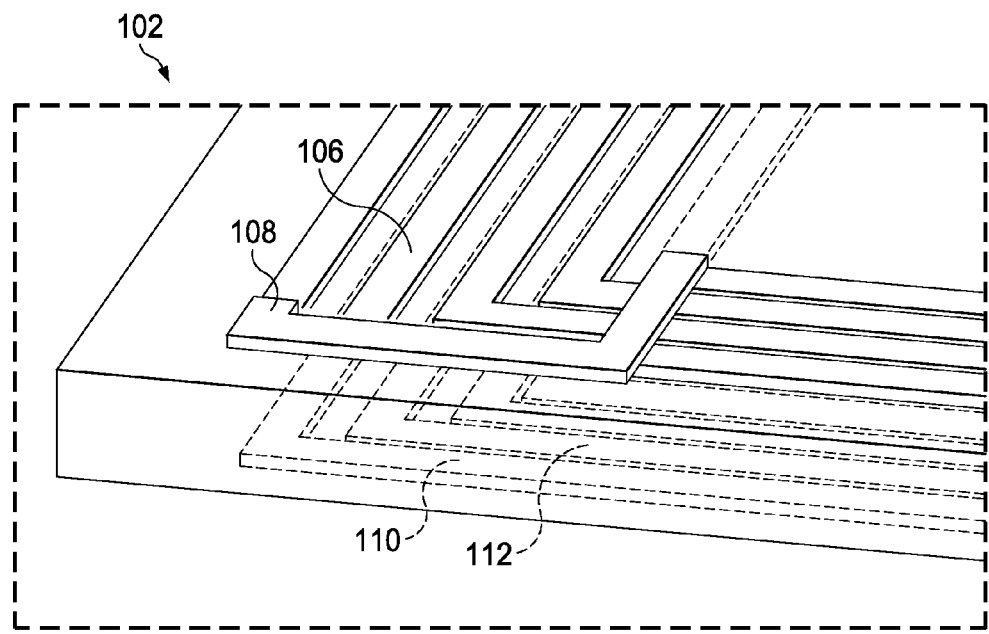
FIG. 4 illustrates a zoomed in view of the galvanic isolator of FIG. 3.
Figure 5:
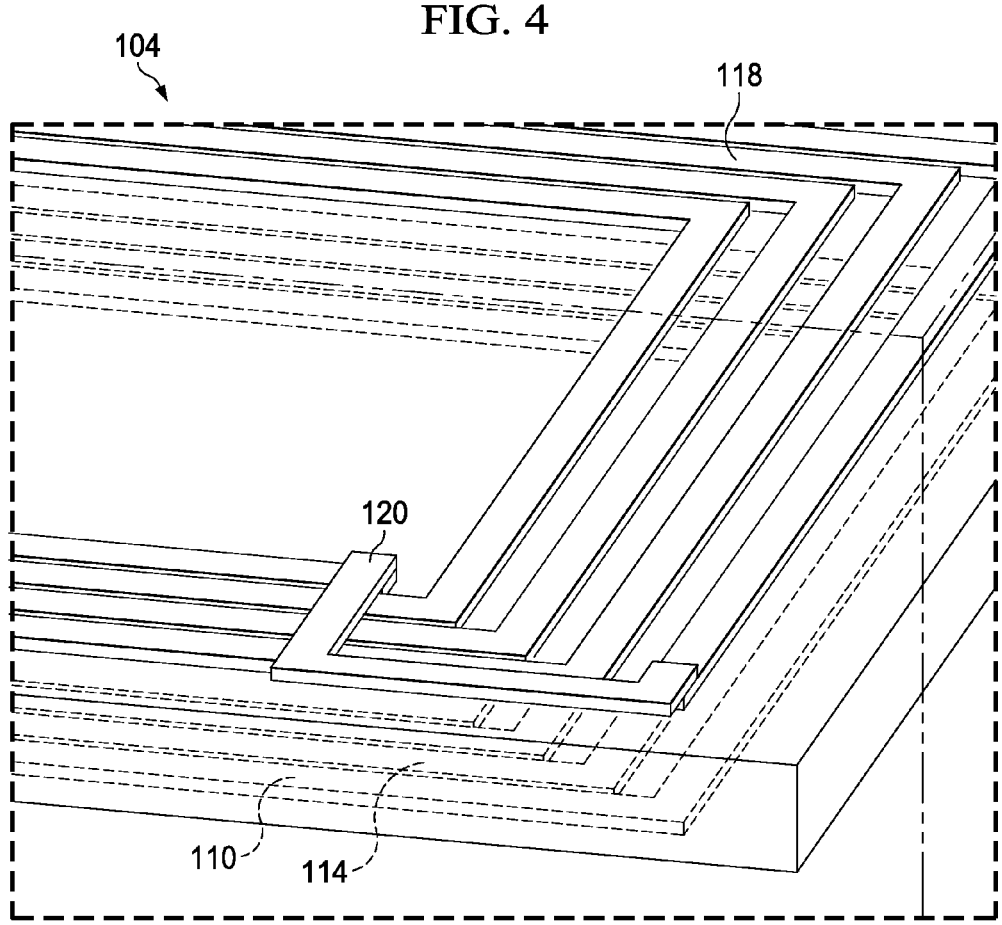
FIG. 5 illustrates another zoomed in view of the galvanic isolator of FIG. 3.

FIG. 3 illustrates another example of a galvanic isolator 100 that could be employed, for example, to implement the galvanic isolator 12 illustrated in FIG. 1. FIG. 4 illustrates a zoomed in portion 102 of FIG. 3. FIG. 5 illustrates another zoomed in portion 104 of FIG. 3. For purposes of simplification of explanation, the same reference numbers are employed in FIGS. 3-5 to denote the same structure. The galvanic isolator 100 can be implemented, for example, as a dual transformer isolator. As explained herein, the dual transformer isolator can operate in a manner similar to a resonator. The dual transformer isolator can have an input stage 106 that can receive an input modulated data signal.

The input stage 106 can be implemented, for example, as an electrically conductive trace formed on a dielectric material shaped as a substantially square winding of one or more turns. The square winding can be center tapped, such that a trace can extend from the center of the input stage 106 to another end of the input stage 106 to provide an input port 108. In some examples, the square winding of the input stage 106 can be formed on a given layer of an SOP, and the center tap can extend through a via to another layer of the SOP that overlays the given layer. The dielectric material between the turns of each winding in the square winding of the input stage 106 can facilitate isolation. Moreover, ends of the trace that form the input stage 106 can be spatially separated by a dielectric at an input port 108. The input stage 106 can receive the input modulated data signal at the input port 108. The modulated data signal can be tuned to a resonant frequency of the input stage 106.

In response to the modulated data signal, the input stage 106 can transmit an input RF data signal that can be provided to a resonant coupler 110 of the galvanic isolator 100. The resonant coupler 110 of the galvanic isolator 100 can be implemented as dual square windings, namely a first winding 112 and a second winding 114 that are coupled by a coupling conductive trace 116 (e.g., a transmission line). The coupling conductive trace 116 can be formed on a different processing layer than the first winding 112 and the second winding 114 and connected between layers through a via. The input stage 106 and the resonant coupler 110 can be electrically isolated by the dielectric material. Moreover, the input stage 106 and the resonant coupler 110 can be separated by a selectable distance (e.g., about 0.5 mm or more) and thus communicate data wirelessly. Further, the resonant coupler 110 can be formed on a different layer of the SOP, such that in some examples, the input stage 106 (or some portion thereof) can overlay the first winding 112 of the resonant coupler 110.

In response to the input RF data signal, the resonant coupler 110 can wirelessly transmit an output RF data signal at the second winding 114 of the resonant coupler 110. The output RF data signal can be received wirelessly, for example, at an output stage 118 of the galvanic isolator 100. The output stage 118 of the galvanic isolator 100 can be implemented in a manner similar to the input stage 106 of the galvanic isolator 100. Accordingly, the output stage 118 of the galvanic isolator 100 can have an output port 120.

The employment of the galvanic isolator 100 implemented as the dual transformer isolator can increase isolation by a series connection of the input stage 106, the resonant coupler 110 and the output stage 118. Moreover, the layer of the SOP on which the resonant coupler 110 is fabricated can operate as a center plate of a series capacitor configuration, which can reduce an electric field in the dielectric layer of the galvanic isolator 100 by about one-half. Moreover, the galvanic isolator 100 can be implemented with four stacked layers, namely, two layers for the input stage 106 and the output stage 118 (one layer for the square windings and one layer for the input port 108 and the output port 120) and two layers for the resonant coupler 110 (one layer for the first winding 112 and the second winding 114 and one layer for the coupling conductive trace 116).

In some examples, the galvanic isolator 100 can be sized about 2 mm by about 1 mm; although it can be implemented different sizes for other purposes. Moreover, the galvanic isolator 100 can achieve percentage bandwidths between 5-100%, with high efficiency coupling (e.g., low power loss) thereby providing a low power per bit transfer cost. In some examples, the galvanic isolator 100 can achieve an isolation of up to about 2-20 kV.

As explained with respect to FIG. 1, features, such as the sizing and spacing of the components of the galvanic isolator 100 can be adjusted to achieve particular characteristics and meet application requirements. For example, by adjusting the size and/or shape of the square windings of the input stage 106, the output stage 118 and the resonant coupler 110, the resonance of each respective component can be set, such that a desired galvanic isolation, percentage bandwidth and/or coupling coefficient can be achieved.

Figure 6:
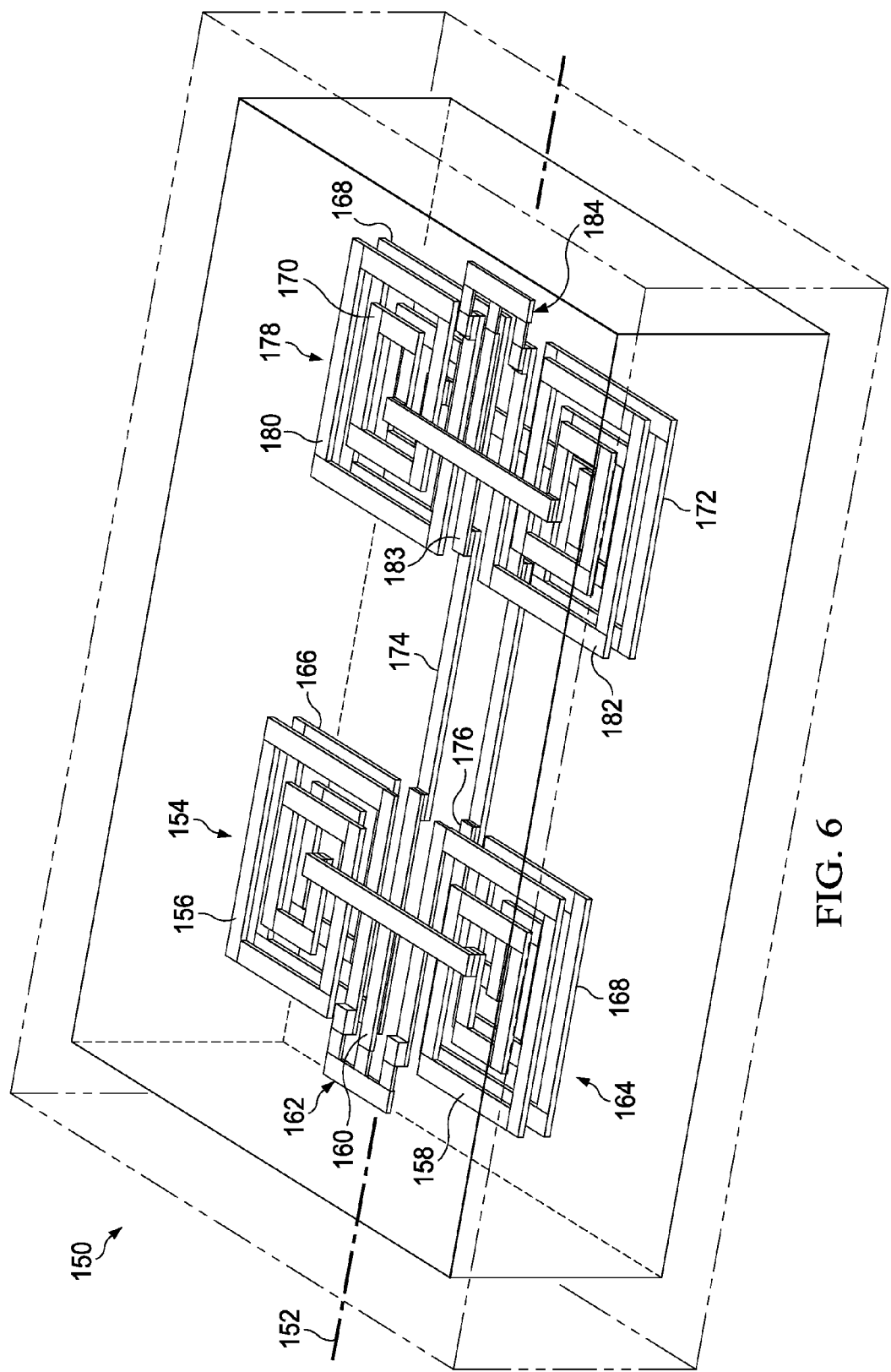
FIG. 6 illustrates yet another example of a galvanic isolator.

FIG. 6 illustrates yet another example of a galvanic isolator 150 that could be employed, for example, as the galvanic isolator 12 illustrated in FIG. 1. The galvanic isolator 150 can be implemented, for example, as a quad transformer isolator. The quad transformer can be implemented as the galvanic isolator 100 (the dual transformer isolator) of FIG. 4 in a mirrored image, such as by implementing the dual transformer isolator with symmetry about a vertical plane that intersects with line 152 to form the quad transformer.

The galvanic isolator 150 can have an input stage 154 can be implemented, for example, as two square windings (each formed of a trace), namely a first winding 156 and a second winding 158. Each of the first winding 156 and the second winding 158 of the input stage 154 can be centered tapped and electrically connected together through a coupling conductive trace 160. Further, each of the first winding 156 and the second winding 158 of the input stage 154 can be coupled via a coupling conductive trace at the other end of the first winding 156 and second winding 158. In some examples, the first winding 156 and the second winding 158 of the input stage 154 can be formed on a given layer of an SOP, and coupling conductive traces can extend through a via to another layer of the SOP that overlays the given layer. The dielectric material between the turns of each winding in the first winding 156 and the second winding 158 of the input stage 154 can facilitate galvanic isolation. Moreover, ends of the trace that form the input stage 154 can be separated at a connection pad to form an input port 162.

The input stage 154 can receive the input modulated data signal at the input port 162. The modulated data signal can be tuned to a resonant frequency of the input stage 154. In response, the first winding 156 and the second winding of the input stage 154 can each transmit a wireless input RF data signal. The input RF data signal can be received at a resonant coupler 164 that can be electrically isolated from the input stage 154 by the dielectric material. The resonant coupler 164 can be implemented as a mirrored image of the resonant coupler 110 illustrated in FIG. 3. Accordingly, the resonant coupler 164 can have the same number of (e.g., four) square windings, namely a first winding 166, a second winding 168, a third winding 170 and a fourth winding 172. In some examples, the first winding 166 and the third winding 170 can be connected through a coupling conductive trace 174. In a similar manner, the second winding 168 and the fourth winding 172 can also be connected through a coupling conductive trace 176. The first winding 166 and the second winding 168 of the resonant coupler 164 can receive the input RF data signal that can cause the third winding 170 and the fourth winding 172 to induce (e.g., wirelessly transmit) an output RF data signal that can be received at an output stage 178. The output stage 178 can be implemented in a manner similar to the input stage 154. For instance, the output stage 178 can include a first winding 180 and a second winding 182 spaced apart from by the selectable distance from the third winding 170 and the fourth winding 172 of the resonant coupler 164. Accordingly, the output stage 178 can include an output port 184 that can output a modulated data signal in response to receipt of the wireless output RF data signal provided from the resonant coupler 165. The output stage 178 can receive the output RF data signal from the third winding 168 and the fourth winding 172 of the resonant coupler 164 at the first winding 180 and the second winding 182 of the output stage 178, respectively. The galvanic isolator 150 can be sized, for example, about 4 mm by about 2 mm or be provided in sizes. Moreover, the galvanic isolator 150 can achieve percentage bandwidths between 5-100%, with high efficiency coupling (e.g., low power loss) thereby providing a low power per bit transfer cost. In some examples, the galvanic isolator 150 can achieve an isolation of up to about 2-20 kV.

As explained with respect to FIG. 1, features, such as the sizing and spacing of the components of the galvanic isolator 150 can be adjusted to achieve desired spectral characteristics. For example, by adjusting the size of the square windings of the input stage 154, the output stage 178 and the resonant coupler 164, the resonance of each respective component can be set, such that a desired galvanic isolation, percentage bandwidth (e.g., pass band) and/or coupling coefficient can be achieved.

In some examples, the input stage 154 and the output stage 178 can be center tapped. In such a situation, the coupling conductive trace 160 of the input stage 154 can be coupled to an electrically neutral node (e.g., AC ground) and another coupling conductive trace 183 of the output stage 184 can also be coupled to the electrically neutral node. Such a configuration can improve filtering of common mode signal (e.g., improved CMTI) and/or improve filtering of low frequency differential signals. As compared to the galvanic isolator 100 implemented as a dual transformer isolator illustrated in FIG. 3, the galvanic isolator 150 implemented as a quad transformer isolator can provide improved CMTI, improved percentage bandwidth and a reduced per bit power transfer cost. Further, the center tappings of the square windings of the galvanic isolator 150 can provide improved common mode rejection.

Figure 7:
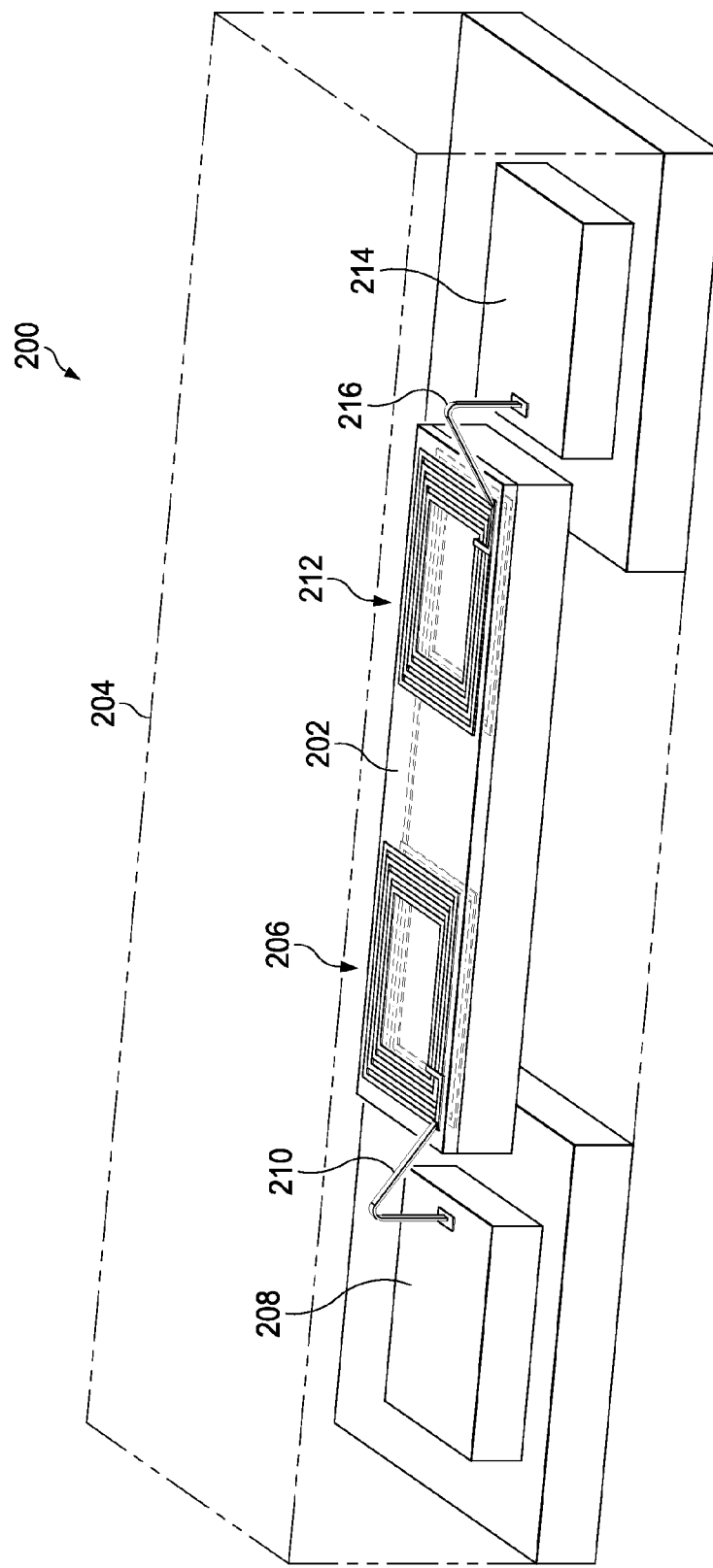
FIG. 7 illustrates an example of a package that includes a galvanic isolator.

FIG. 7 illustrates an example of a package 200 that includes a galvanic isolator 202 (e.g., corresponding to the galvanic isolator 100 illustrated in FIG. 3) that is packaged in a dielectric material 204, such as laminate or flex material. Packaging the galvanic isolator 202 in the dielectric material 204 can improve isolation of the galvanic isolator 202 from package ground coupling. Although only the galvanic isolator 100 illustrated in FIG. 3 is demonstrated in the example of FIG. 7, in other examples, the galvanic isolator 50, illustrated in FIG. 2 or the galvanic isolator 150 illustrated in FIG. 6 could be packaged in a similar manner. An input stage 206 of the galvanic isolator 202 can be coupled to a first connection pad 208 through interconnect, such as a bonding wire 210. Additionally, an output stage 212 of the galvanic isolator 202 can be coupled to a second connection pad 214 through another bonding wire 216. In this manner, an input circuit and an output circuit, such as the input circuit 10 and the output circuit 22 illustrated in FIG. 1 can be connected to the galvanic isolator 202.

Figure 8:
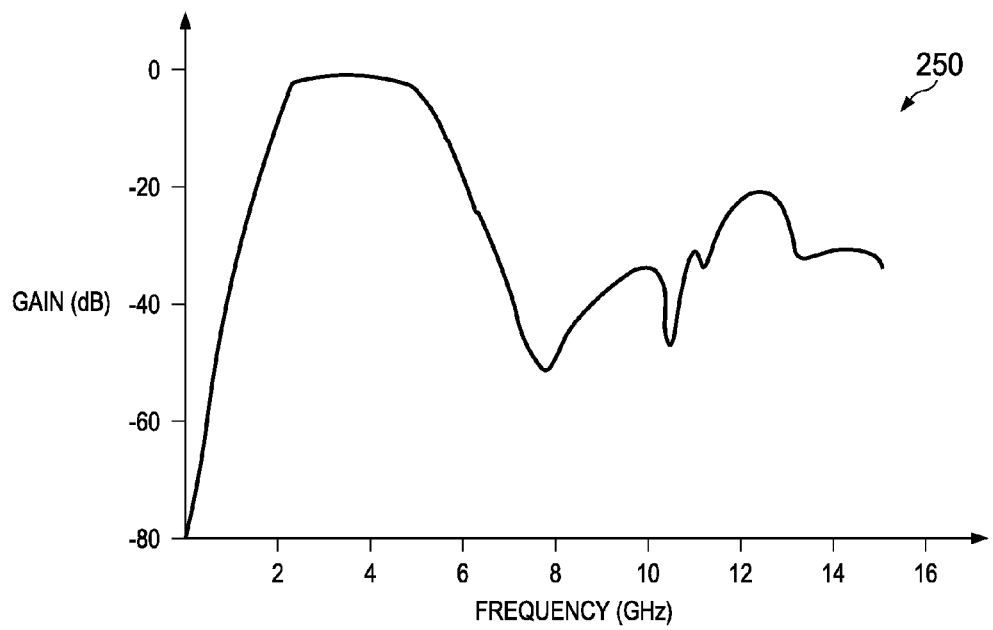
FIG. 8 illustrates an example of a gain diagram of a galvanic isolator.
Figure 9:
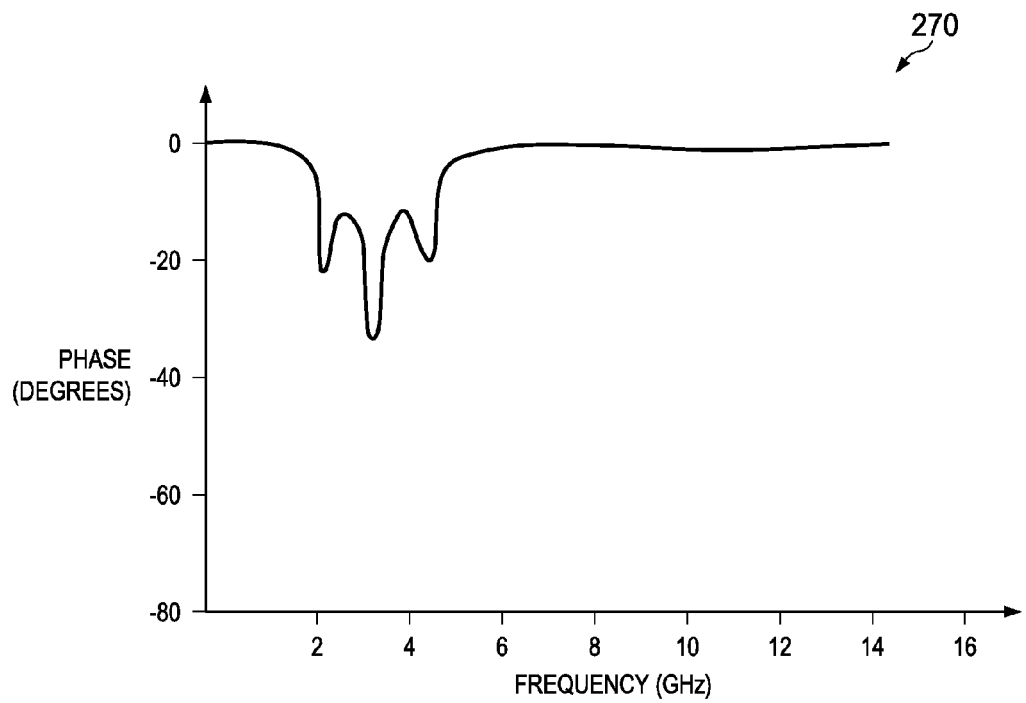
FIG. 9 illustrates an example of a phase diagram of a galvanic isolator.

FIG. 8 illustrates an example of a gain diagram 250 of the galvanic isolator 12 illustrated in FIG. 1 with the gain in decibels (dB) plotted as a function of frequency in gigahertz (GHz). FIG. 9 illustrates a corresponding example of a phase diagram 270 of the galvanic isolator 12 illustrated in FIG. 1 with the phase (in degrees) plotted as a function of frequency in gigahertz (GHz). The gain diagram 250 and the phase diagram 270 can characterize, for example, the galvanic isolator 100 of FIG. 3, which is implemented as dual transformer isolator. As is illustrated, the galvanic isolator can have a bandpass from about 2.3 GHz to about 5.15 GHz and a cutoff frequency of about 1 GHz, which can correspond to a gain of about −38 dB. Additionally, as illustrated in the phase diagram 270, in the bandpass region, the phase can change by less than about 38°.

Figure 10:
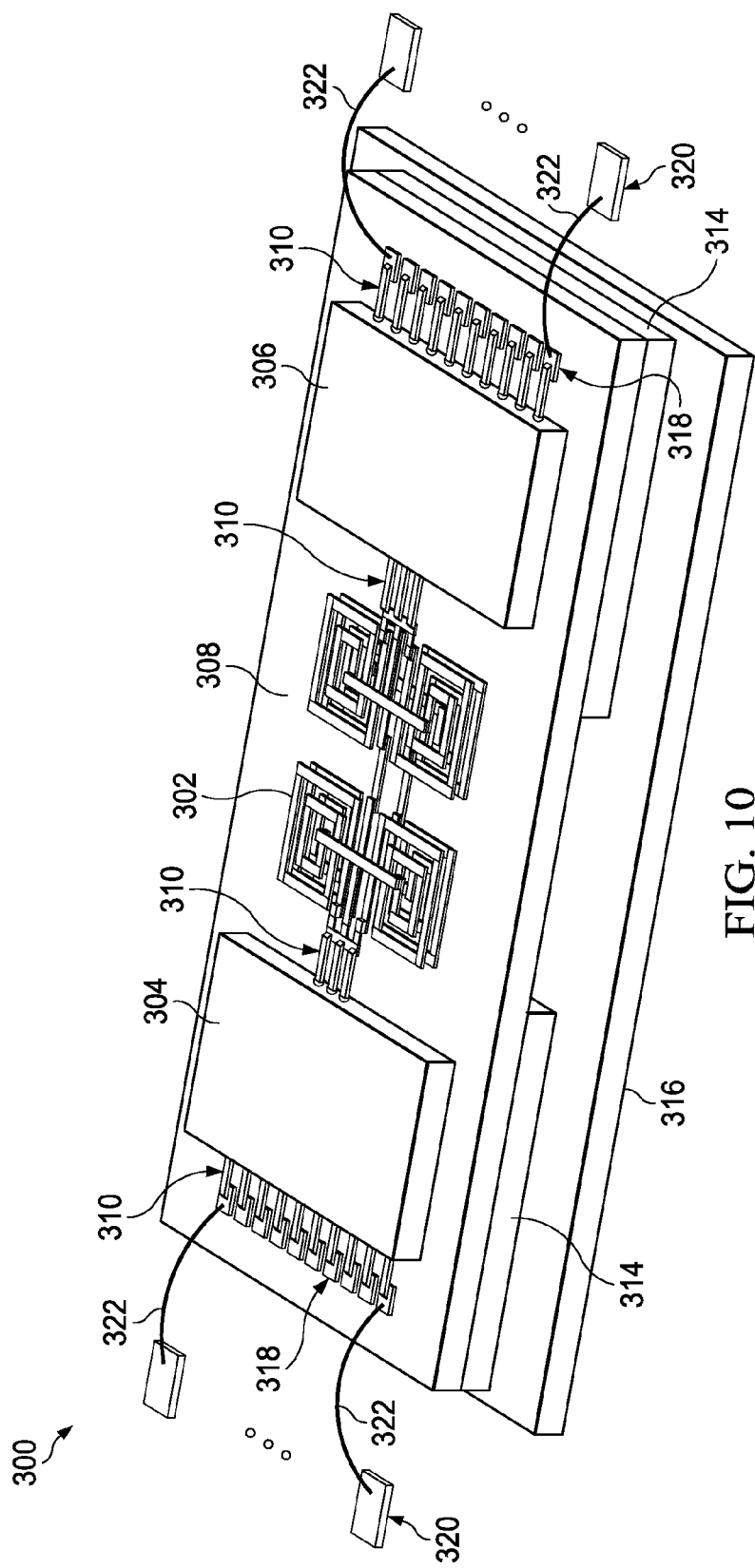
FIG. 10 illustrates an isometric view of an SOP that includes a galvanic isolator.
Figure 11:
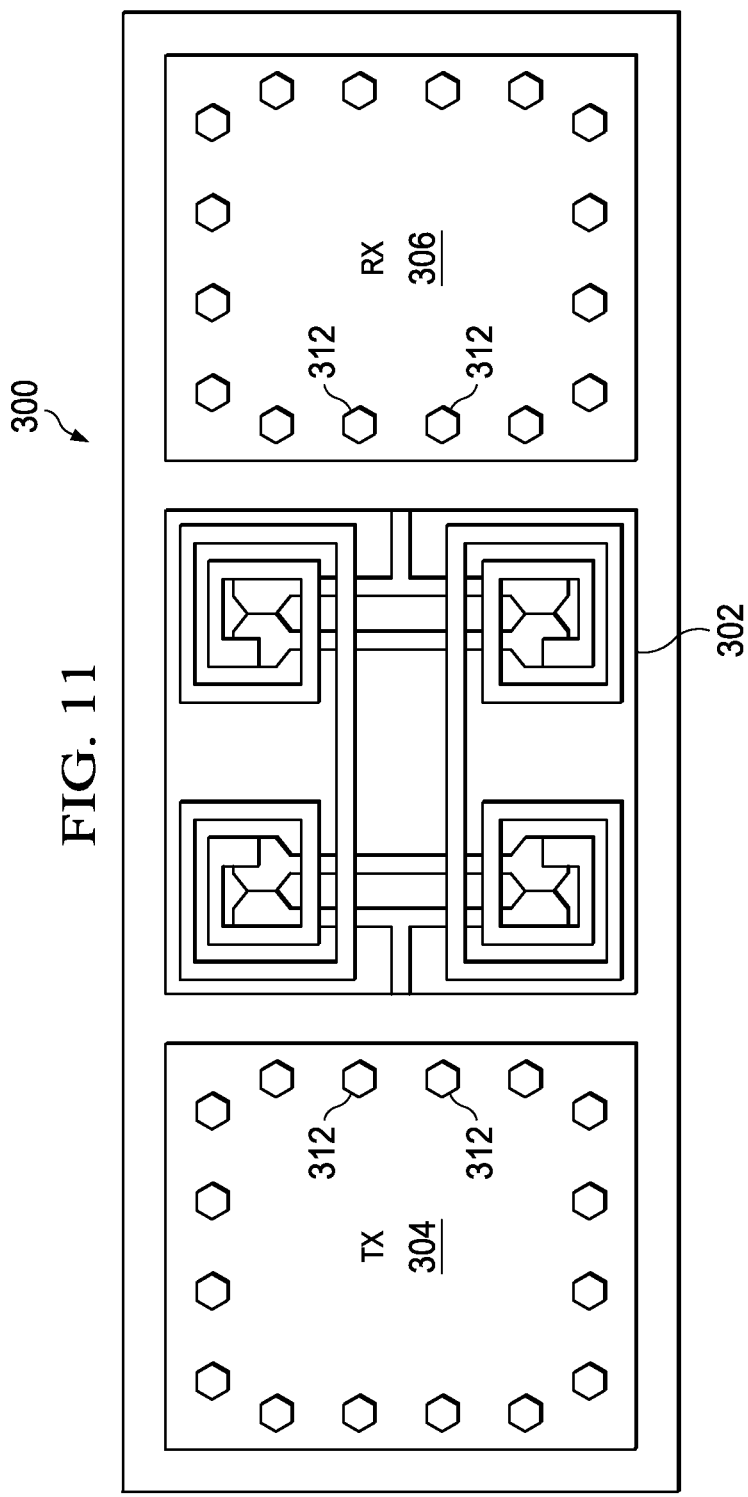
FIG. 11 illustrates a plan view of the SOP illustrated in FIG. 10.

FIG. 10 illustrates an isometric view of example SOP 300 that could be employed to implement the SOP 8 of FIG. 1. FIG. 11 illustrates a plan view of the SOP 300 illustrated in FIG. 10. The SOP 300 illustrates packaging details that can be employed to facilitate galvanic isolation. The SOP 300 can include, for example, a galvanic isolator 302 that could be employed, for example to implement the galvanic isolator 12 illustrated in FIG. 1. In the present example, the galvanic isolator 302 corresponds to the galvanic isolator 150 (the quad transformer isolator) of FIG. 6, but in other examples, other configurations of the galvanic isolator 302 could alternatively be employed. The galvanic isolator 302 can be coupled to a transmitter 304 that can be employed to implement the input circuit 10 illustrated in FIG. 1. Additionally, the galvanic isolator 302 can be coupled to a receiver 306 that could be employed to implement the output circuit 22 illustrated in FIG. 1. The transmitter 304, the galvanic isolator 302 and the receiver 306 can be implemented on separate dies of the SOP 300. Additionally, the transmitter 304 can employ a first ground potential, and the receiver 306 can employ a second ground potential. The first ground potential and the second ground potential can be different ground potentials. The difference in the first and second ground potentials can range from several volts to thousands of volts or more.

The transmitter 304 and the receiver 306 can each overlay a common substrate 308 that can be implemented, for example, as a laminate. The common substrate 308 can include a plurality of conductive traces embedded therein that can be coupled to the galvanic isolator 302, which conductive traces can be referred to as embedded conductive traces 310. In some examples, the galvanic isolator 302 can be embedded in the substrate 308. Additionally, the transmitter 304 and the receiver 306 can include connection pads 312 (e.g., solder pads) that can contact connection pads coupled to the embedded conductive traces through vias. In this manner, the transmitter 304 and the receiver 306 can communicate with the galvanic isolator 302 through the embedded conductive traces 310, thereby avoiding the need for bonding wires. The embedded conductive traces 310 can support relatively high frequency signals. For example, the embedded conductive traces 310 can have a center frequency of about 1 GHz to about 500 GHz, such that high-speed communication between the transmitter 304 and the receiver 306 (through the galvanic isolator 302) can occur.

The common substrate 308 can overlay a thermal base 314 that can facilitate heat dissipation. Alternatively, a paddle could be employed in place of the thermal base 314. In some examples, the thermal base 314 (or paddle) can be coupled to another substrate 316 that could be employed, for example, as a heat sink.

In some examples, the transmitter 304 and the receiver 306 can employ flip chip technologies to couple the transmitter 304 and the receiver 306 to the embedded conductive traces 310. For example, the connection pads 312 on the receiver 306 and the transmitter 304 can have, but is not restricted to solder balls deposited thereto and then "flipped" and connected to the connection pads of the conductive traces 310.

Similarly, the transmitter 304 and the receiver 306 can be coupled to external connection pads 318 through embedded conductive traces 310. The external connection pads can be coupled to a lead-frame 320 through bonding wires 322. In some examples, the lead-frame 320 can be connected to a first circuit and a second circuit, such as the first circuit 4 and the second circuit 6 illustrated in FIG. 1. By employing the packaging details of the SOP 300, improved control and P-N junction balance between electron drift and electron diffusion can be realized.

Figure 12:
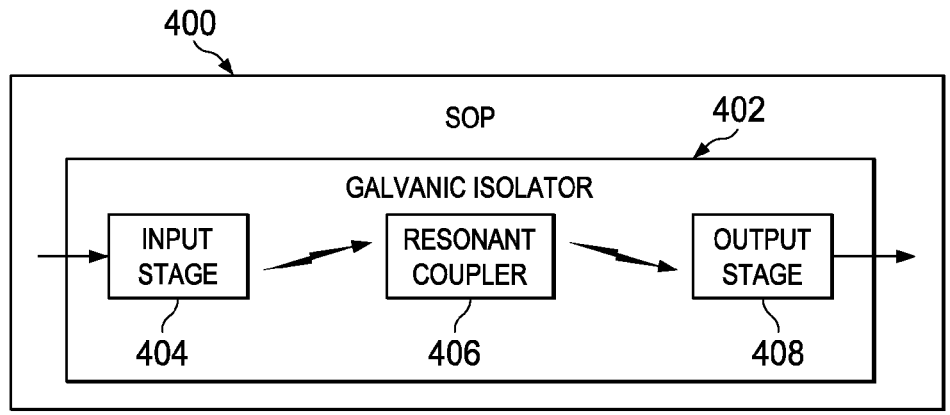
FIG. 12 illustrates yet another example of an SOP that includes a galvanic isolator.

FIG. 12 illustrates an example of an SOP 400 that could be employed, for example, as the SOP 8 illustrated in FIG. 1. The SOP 400 can include a galvanic isolator 402. The galvanic isolator 402 can include an input stage 404 configured to transmit an input RF signal in response to receiving an input modulated signal. The galvanic isolator 402 can also include a resonant coupler 406 electrically isolated from the input stage 404 by a dielectric. The resonant coupler 406 can be configured to filter the input RF signal and to transmit an output RF signal in response to the input RF signal. The galvanic isolator can further include an output stage 408 electrically isolated from the resonant coupler 406 by a dielectric. The output stage 408 can be configured to provide an output modulated signal in response to receiving the output RF signal.

Figure 13:
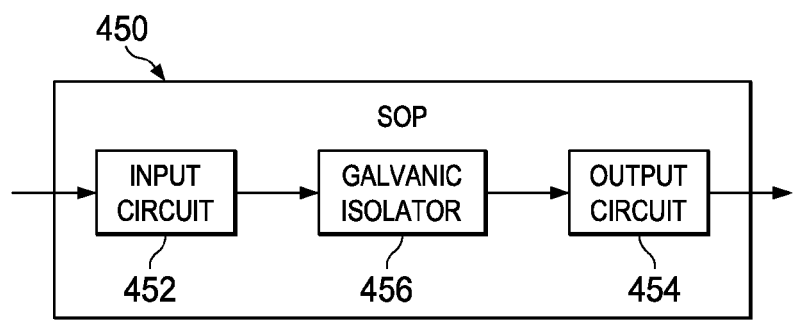
FIG. 13 illustrates still yet another example of an SOP that includes a galvanic isolator.

FIG. 13 illustrates an example of an SOP 450 that could be employed, for example, as the SOP 8 illustrated in FIG. 1. The SOP 450 can include an input circuit 452 formed on a first die of the SOP 450. The input circuit 452 can be configured to modulate an input signal onto a predefined carrier frequency to provide an input modulated signal. The SOP 450 can also include an output circuit 454 formed on a second die of the SOP 450. The output circuit 454 can be configured to demodulate an output modulated signal. The SOP 450 can further include a galvanic isolator 456 formed on a third die of the SOP 450. The galvanic isolator 456 can be configured to transmit an input RF signal based on the input modulated signal. The galvanic isolator 456 can also be configured to transmit an output RF signal in response to wirelessly receiving the input RF signal. The galvanic isolator can further be configured to provide the output modulated signal in response to wirelessly receiving the output RF signal.

Figure 14:
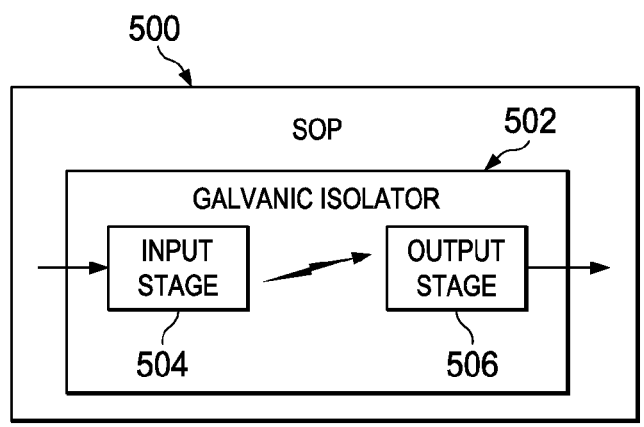
FIG. 14 illustrates still another example of an SOP that includes a galvanic isolator.

FIG. 14 illustrates another example of an SOP 500 that could be employed, for example, as the SOP 8 illustrated in FIG. 8. The SOP 500 can include a galvanic isolator 502 configured to filter an input modulated signal. The galvanic isolator 502 can include an input stage 504 configured to transmit a signal corresponding to an output RF signal in response to receiving the input modulated signal. The galvanic isolator 500 can also include an output stage 506 electrically isolated from the input stage 504 by a dielectric. The output stage 506 configured to provide an output modulated signal in response to receiving the output RF signal.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A system on a package (SOP) comprising:
   a galvanic isolator comprising:
   an input stage configured to transmit an input RF signal in response to receiving an input modulated signal;
   a resonant coupler electrically isolated from the input stage by a dielectric, the resonant coupler being configured to:
   filter the input RF signal; and
   provide an output RF signal in response to the input RF signal; and an output stage electrically isolated from the resonant coupler by the dielectric, the output stage being configured to provide an output modulated signal in response to receiving the output RF signal;
   wherein the input stage, the resonant coupler and the output stage each comprises a resonant element that includes a given loop and another loop connected in series.

2. The SOP of claim 1, wherein the input stage is further configured to:
   receive the input modulated signal at the given loop of the input stage; and
   transmit the input RF signal from the other loop of the input stage to the given loop of the resonant coupler.

3. The SOP of claim 2, wherein the resonant coupler is configured to transmit the output RF signal from the other loop of the resonant coupler to the given loop of the output stage in response to receiving the input RF signal at the given loop of the resonant coupler.

4. A system on a package (SOP) comprising:
   a galvanic isolator comprising:
   an input stage configured to transmit an input RF signal in response to receiving an input modulated signal;
   a resonant coupler electrically isolated from the input stage by a dielectric, the resonant coupler being configured to:
   filter the input RF signal; and
   provide an output RF signal in response to the input RF signal; and an output stage electrically isolated from the resonant coupler by the dielectric, the output stage being configured to provide an output modulated signal in response to receiving the output RF signal;
   wherein the resonant coupler comprises a plurality of resonant elements that are wirelessly coupled in series and configured to provide desired spectral characteristics.

5. A system comprising:
a given circuit configured to provide an input signal;
an a system on a package (SOP) comprising:
   a galvanic isolator comprising:
      an input stage configured to transmit an input RF signal in response to receiving an input modulated signal corresponding to the input signal;
      a resonant coupler electrically isolated from the input stage by a dielectric, the resonant coupler being configured to:
         filter the input RF signal; and
         provide an output RF signal in response to the input RF signal; and
      an output stage electrically isolated from the resonant coupler by the dielectric, the output stage being configured to provide an output modulated signal in response to receiving the output RF signal; and
another circuit connected to the output stage and configured to receive an output signal corresponding to the output modulated signal, wherein the given circuit and the another circuit are configured to operate based on different voltage levels;
wherein the resonant coupler further comprises a plurality of stages, wherein each stage comprises a resonant element and each of the plurality of stages are wirelessly coupled in series.

6. A system on a package (SOP) comprising:

a galvanic isolator configured to filter an input modulated signal, the galvanic isolator comprising:

an input stage configured to transmit a signal corresponding to an output RF signal in response to receiving the input modulated signal; and output stage electrically isolated from the input stage by a dielectric, the output stage being configured to provide an output modulated signal in response to receiving the output RF signal;

wherein the input stage and the output stage are centered tapped and coupled to a respective node at the center tapping, wherein the respective node of the input stage and the output stage is also coupled to an electrically neutral node.

* * * * *